(12) United States Patent
Sabate et al.

(10) Patent No.: US 7,116,166 B2
(45) Date of Patent: Oct. 3, 2006

(54) HIGH FIDELITY, HIGH POWER SWITCHED AMPLIFIER

(75) Inventors: Juan Antonio Sabate, Gansevoort, NY (US); Richard S. Zhang, Rexford, NY (US); Luis Jose Garces, Niskayuna, NY (US); Paul Michael Szczesny, Ballston Lake, NY (US); Qiming Li, Shanghai (CN); William Frederick Wirth, Johnson Creek, WI (US)

(73) Assignee: General Electric Company, Niskayuna, NY (US)

( * ) Notice: Subject to any disclaimer, the term of this patent is extended or adjusted under 35 U.S.C. 154(b) by 106 days.

(21) Appl. No.: 10/867,598

(22) Filed: Jun. 15, 2004

(65) Prior Publication Data

US 2005/0275404 A1    Dec. 15, 2005

(51) Int. Cl.
*H03F 3/00* (2006.01)
*H03F 3/217* (2006.01)

(52) U.S. Cl. ................... 330/146; 330/251; 330/207 A

(58) Field of Classification Search ..................... None
See application file for complete search history.

(56) References Cited

U.S. PATENT DOCUMENTS

| | | | | |
|---|---|---|---|---|
| 3,581,212 | A | 5/1971 | McMurray | 328/14 |
| 5,270,657 | A | 12/1993 | Wirth et al. | 324/322 |
| 5,663,647 | A | 9/1997 | Wirth et al. | 324/322 |
| 6,031,746 | A | 2/2000 | Steigerwald et al. | 363/71 |
| 6,118,337 | A * | 9/2000 | Schweighofer | 330/10 |
| 6,166,602 | A | 12/2000 | Steigerwald et al. | 330/251 |
| 6,172,558 | B1 * | 1/2001 | Nowak et al. | 330/10 |
| 6,995,609 | B1 * | 2/2006 | Yokoyama | 330/10 |

FOREIGN PATENT DOCUMENTS

| | | |
|---|---|---|
| DE | 19812069 | 9/1999 |
| EP | 0987818 | 3/2000 |

OTHER PUBLICATIONS

Sabata J. et al.; "High-power high-fidelity switching amplifier driving gradient coils for MRI systems"; Power Electronics Specialists Conference, 2004. PECS 04, 2004 IEEE 35th Annual Aachen, Germany Jun. 20-25, 2004, Piscataway, NJ, USA, IEEE, US, Jun. 20, 2004; pp. 261-266.

Steigerwald R. L. et al.; "High-power, high-performance switching amplifier for driving magnetic resonance imaging gradient coils"; Power Electronics Specialists Conference, 2000; PESC 00. 2000 IEEE 31st Annual Jun. 18-23, 2000, Piscataway, NJ, USA, IEEE, Jun. 18, 2000; pp. 643-648.

* cited by examiner

*Primary Examiner*—Khanh van Nguyen
(74) *Attorney, Agent, or Firm*—Fletcher Yoder

(57) ABSTRACT

A gradient amplifier arrangement is described that comprises a gradient amplifier power stage. The device may be employed to provide a current to a gradient coil, as in a MRI system. The circuitry disclosed includes a series coupling of a first bridge amplifier operating at a first voltage, a second bridge amplifier operating at a second voltage, a third bridge amplifier operating at a third voltage, and a gradient amplifier control stage. The amplifiers may provide output voltages at different levels, and may be switched at different times and frequencies to provide a range of output voltage and current levels.

45 Claims, 8 Drawing Sheets

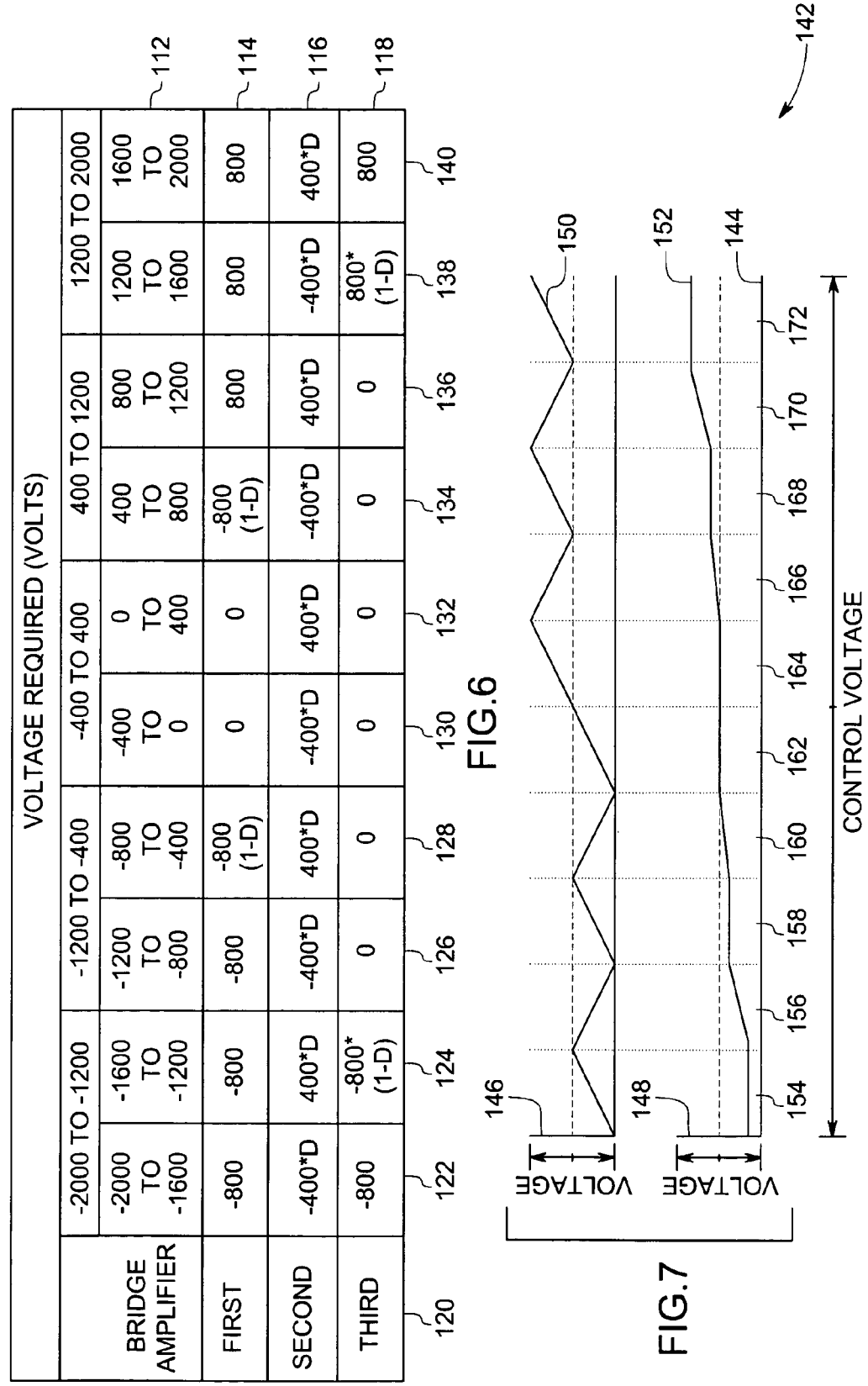

HIGH FIDELITY, HIGH POWER SWITCHED AMPLIFIER

BACKGROUND

The invention relates generally to magnetic resonance imaging systems (MRI) and more specifically to switching amplifiers adapted for use in MRI systems.

A conventional MRI device establishes a homogenous magnetic field generally along a central axis of a subject that is to undergo an MRI procedure. This homogeneous magnetic field affects gyro magnetic material of the subject for imaging by aligning the nuclear spins (in atoms and molecules forming the body tissue in medical applications, for example) along the direction of the magnetic field. If the orientation of the nuclear spins is perturbed out of alignment with the magnetic field, the nuclei attempt to realign their spins with the field. Perturbation of the orientation of nuclear spins is typically caused by application of radio frequency (RF) pulses tuned to the Larmor frequency of the material of interest. During the realignment process, the nuclei precess about their axes of and emit electromagnetic signals that may be detected by one or more RF detector coils placed on or about the subject.

The frequency of the magnetic resonance (MR) signal emitted by a given precessing nucleus depends on the strength of the magnetic field at the location of the nucleus. It is possible to distinguish signals originating from different locations within the subject by using encoding, typically phase and frequency encoding, created by gradient coils that apply gradient fields over the main magnetic field. A typical MRI system comprises three gradient coils for providing respective fields along the X, Y and Z axes. Control of the gradient coils allows for orientation of the axes for encoding of locations within the subject, and for selection of a desired "slice" for imaging.

Gradient coils produce additional magnetic fields that are superimposed on the primary magnetic field to permit localization of the image slices and also provide phase encoding and frequency encoding. The encoding permits identification of the origin of resonance signals during later image reconstruction. The image quality and resolution depends significantly on how the applied fields can be controlled. To achieve faster imaging rates, the gradient fields are typically modified at frequencies of several kHz. Control of the gradient coils is generally performed in accordance with pre-established protocols or sequences, called pulse sequence descriptions, permitting many types of tissues to be imaged and distinguished from other tissues in a medical context, or for imaging various features of interest in other applications.

Typically, a gradient coil operates in ranges of several hundred amperes of current and several thousand volts. Therefore, the gradient coil requires a gradient amplifier to supply the coils with the required current and voltage levels. The gradient amplifier is typically a power amplifier. Amplifier designs may be quite complex because the required precision in signals may be less than a milliamp for any current level in the coil current for high performance MRI systems providing quality images.

Earlier implementations of gradient amplifiers used linear amplifiers that provided high fidelity. However, given present power levels, the use of these amplifiers becomes impractical due to the higher voltages and currents. Present day techniques use hybrid systems that combine linear amplifiers with switching power stages. Such systems use bridges in parallel or bridges stacked to meet the system requirements, typically employing power semiconductor devices. The linear amplifiers provide bandwidth and control, while the switching power stages provide a boost in voltage for fast transitions.

While there are inherent advantages of such systems, such as the ability to provide higher power levels, the performance of these hybrid designs is limited by the capabilities of the linear amplifiers. A better functioning gradient coil, capable of inducing better gradients in the primary magnetic field could result in numerous advantages, such as increase in the cost effectiveness, improvement of the dynamic performance, decrease in the examination time, improvement in spatial resolution, improvement in temporal resolution and significant improvement in the quality of the resultant images.

In view of the limitations of current MRI gradient amplifier techniques, there is a need for a new power stage architecture that provides high power and delivers high fidelity through novel circuit topologies and control mechanisms.

BRIEF DESCRIPTION

Briefly, in accordance with one aspect of the present technique, a gradient amplifier power stage provides a current to a gradient coil. The power stage includes a series coupling of a first bridge amplifier operating at a first voltage, a second bridge amplifier operating at a second voltage, a third bridge amplifier operating at a third voltage, and a gradient coil.

In accordance with another aspect of the present technique, a gradient amplifier comprises a gradient amplifier power stage that includes a series coupling of a first bridge amplifier operating at a first voltage, a second bridge amplifier operating at a second voltage, a third bridge amplifier operating at a third voltage, and a gradient coil; and a first embodiment of a gradient amplifier power stage.

In accordance with another aspect of the present technique, a gradient amplifier comprises a gradient amplifier power stage that includes a series coupling of a first bridge amplifier operating at a first voltage, a second bridge amplifier operating at a second voltage, a third bridge amplifier operating at a third voltage, and a gradient coil; and a second embodiment of a gradient amplifier power stage.

In accordance with yet another aspect of the present technique, a method is provided for supplying current to a gradient coil. The method includes providing a voltage supply at a first voltage to a first bridge amplifier, providing a voltage supply at a second voltage to a second bridge amplifier, providing a voltage supply at a third voltage to a third bridge amplifier, coupling the first, second and third bridge amplifiers in series with a gradient coil and applying a pulse width modulation scheme to modulate the power applied across the gradient amplifier by each of the three bridge amplifiers.

DRAWINGS

These and other features, aspects, and advantages of the present invention will become better understood when the following detailed description is read with reference to the accompanying drawings in which like characters represent like parts throughout the drawings, wherein:

FIG. 6 illustrates an exemplary control logic mechanism embodied in the gradient amplifier illustrated in FIG. 5;

FIG. 7 is a diagrammatical illustration of a relationship between control voltages and output voltage across the gradient coil for the embodiment of the gradient amplifier illustrated in FIG. 5;

DETAILED DESCRIPTION

Figure 1:
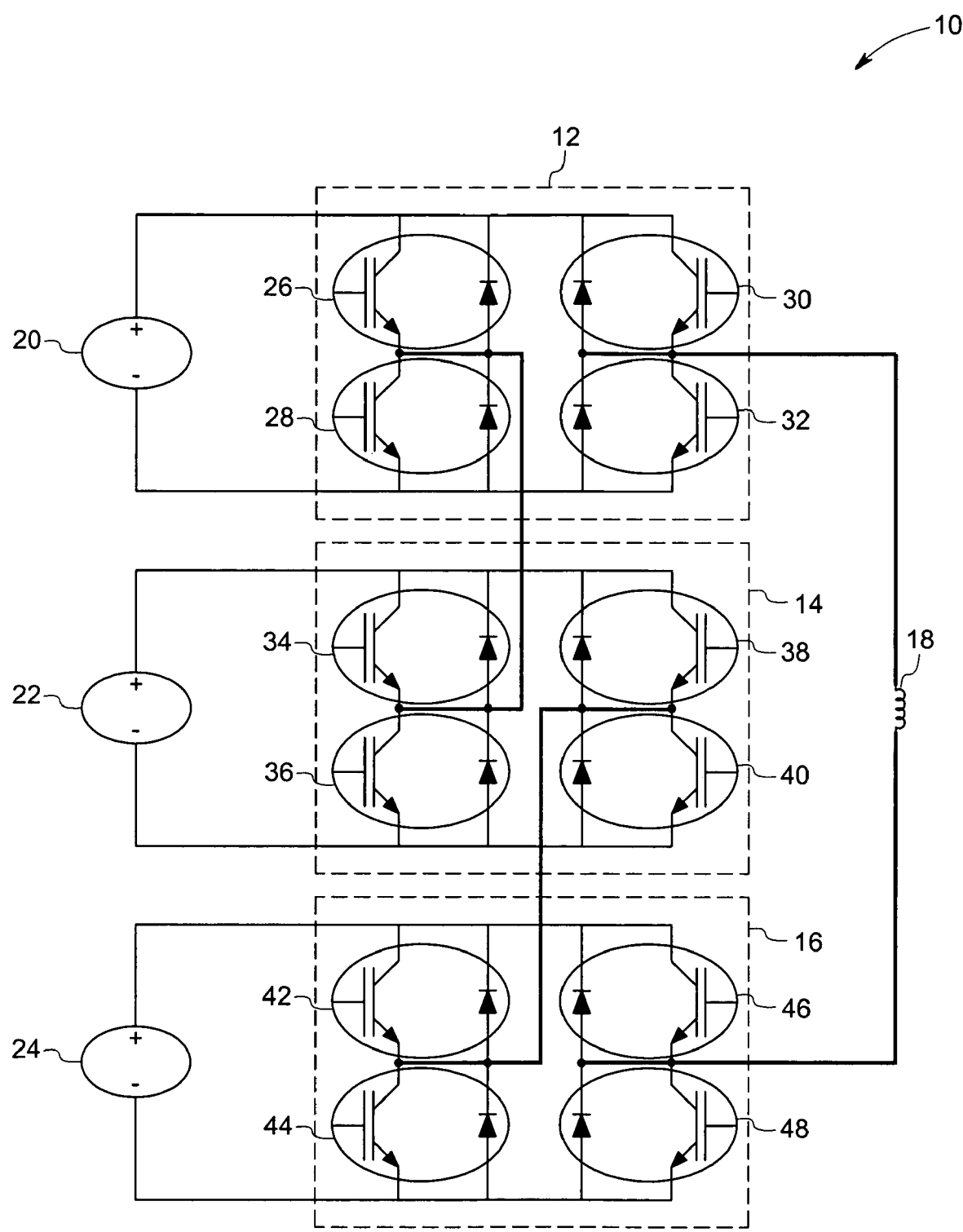
FIG. 1 is a schematic representation of an embodiment of a gradient amplifier power stage in accordance with aspects of the present technique.

Turning now to the drawings, and referring first to FIG. 1, an embodiment of a gradient amplifier power stage 10 is represented schematically as comprising a first bridge amplifier 12, a second bridge amplifier 14, a third bridge amplifier 16, a gradient coil 18, a first direct-current (DC) voltage source 20, a second DC voltage source 22, and a third DC voltage source 24. Each component is described in further detail below.

In the embodiment illustrated in FIG. 1, the first DC voltage source 20 is coupled across the first bridge amplifier 12, the second DC voltage source 22 is coupled across the second bridge amplifier 14, and the third DC voltage source 24 is coupled across the third bridge amplifier 16. Furthermore, the first bridge amplifier 12, the second bridge amplifier 14 and the third bridge amplifier 16 are coupled together in series with the gradient coil 18. The first bridge amplifier 12 further comprises transistor modules 26, 28, 30 and 32. Transistor modules 26 and 28, which may be any suitable type of solid state switching device, such as insulated gate bipolar junction transistors (IGBTs) or metal oxide semiconductor field effect transistors (MOSFETs), are connected in series to form a first leg of the bridge amplifier 12. Similarly, transistor modules 30 and 32 are connected in series to form a second leg of the bridge amplifier 12. The first and second legs are connected in parallel. Due to the nature of the connections, either one of the legs can be thought of as an input while the other leg can be an output. In a similar manner of construction, transistor modules 34, 36, 38 and 40 make up the second bridge amplifier 14 and transistor modules 42, 44, 46 and 48 make up the third bridge amplifier 16.

In a typical application, the gradient amplifier illustrated may be used in various systems such as magnetic resonance imaging (MRI) systems. An MRI system typically consists of three gradient coils. A corresponding gradient amplifier of the type described herein would thus drive each gradient coil. The gradient coils are used to alter a primary magnetic field of the MRI system by creating gradient fields at frequencies of up to several kilohertz for a fast imaging. Typical inductance levels in a gradient coil can be in the range of several hundred micro-Henries to a few milli-Henries. Typical voltage and current levels in the gradient coil can be in the order of a few thousands volts and several hundred amperes. While the below described embodiments refer to MRI system applications, it should be borne in mind that the scope of use of the present techniques includes other areas where high voltage and high current at very high fidelity are required.

Continuing with FIG. 1, bridge amplifiers 12, 14, 16 share a similar topology. Depending on a voltage applied across the bridge amplifier, the transistor modules in the bridge amplifier can be of different types. For example, when the applied voltage is about 800 volts, the transistor module 26 can be of a higher voltage rating but relatively slower. When the applied voltage is about 400 volts, the transistors can be of a lower voltage rating but relatively faster. The current ratings for commercially available transistors permit a design without a need for paralleling the bridge amplifiers. An interleaved operation of the three bridge amplifiers 12, 14, 16 provides a current with a low amplitude ripple. In one embodiment, the first bridge amplifier and the third bridge amplifier switch at a frequency of about 31.25 kHz while the second bridge amplifier can switch at a frequency of about 62.5 kHz. Also, as discussed in greater detail below, in a present embodiment, amplifiers 12 and 16 provide higher voltage output (e.g. 800 volts), while amplifier 14 provides a lower voltage output (e.g. 400 volts). By appropriately switching the bridge amplifiers 12, 14, 16, various intermediate and combined voltages are achieved with improved overall performance. Total power delivered to the gradient coil typically consists active and reactive power components. By controlling these components in a proper manner, the stability of the power delivered to the gradient coil 18 can be assured. Controlling ensures that no part of the reactive power component supplied to the gradient coil flows between the bridge amplifiers. The subsequent sections illustrate and describe in detail, exemplary embodiments of a gradient amplifier control stage in accordance with aspects of the present technique.

Figure 2:
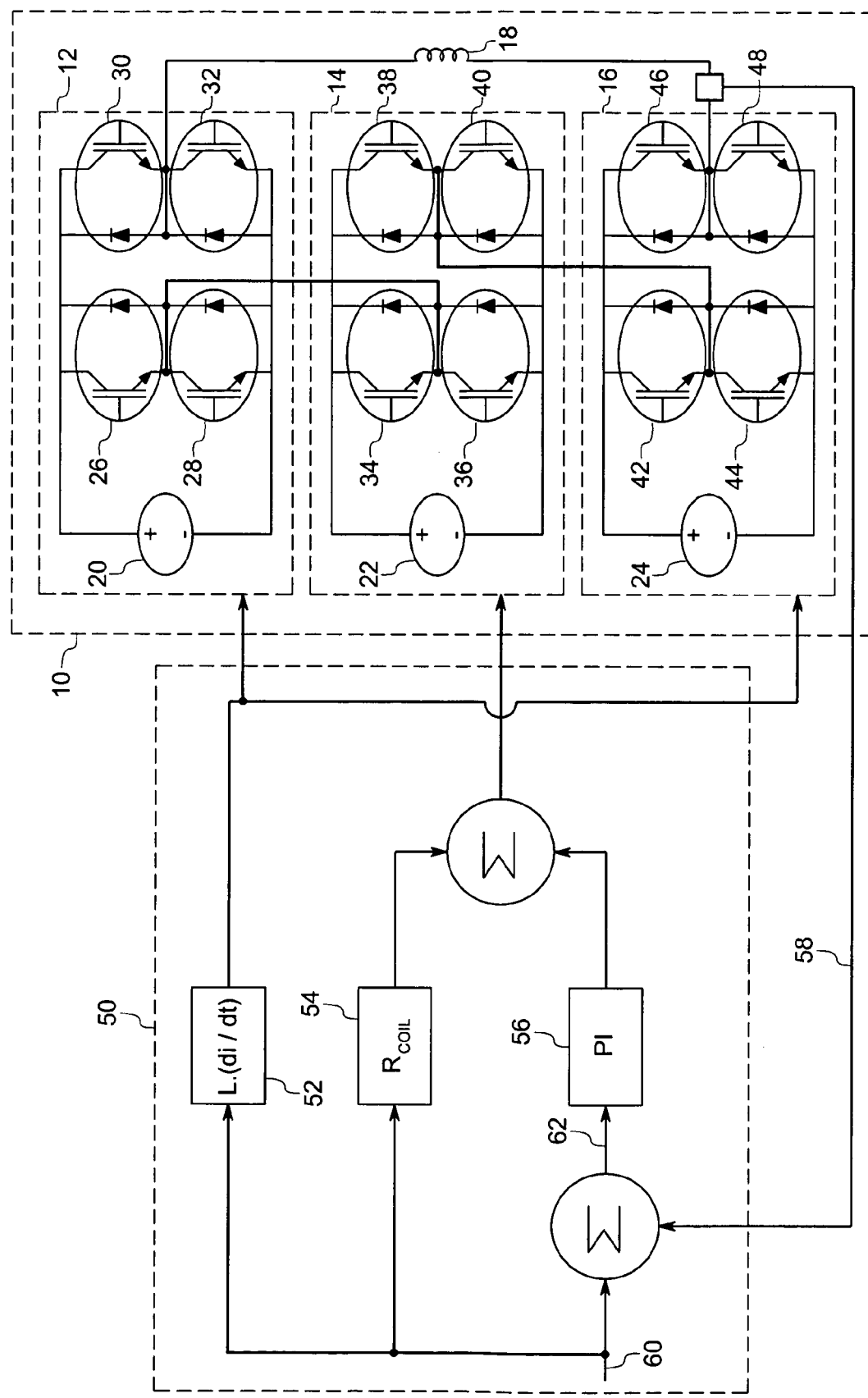
FIG. 2 is a diagrammatical illustration of an exemplary gradient amplifier comprising a gradient amplifier power stage of the type shown in FIG. 1, and one embodiment of a gradient amplifier control stage.

FIG. 2 illustrates an exemplary gradient amplifier comprising gradient amplifier power stage 10 (as illustrated in FIG. 1) and an embodiment of a gradient amplifier control stage 50. The gradient amplifier control stage 50 includes a feed forward mechanism 52 based on the inductance voltage drop across the gradient coil 18, a second feed forward mechanism 54 based on the resistive voltage drop of the gradient coil 18 and a proportional integral (PI) control mechanism 56 that provides a feedback based on a deviation of a feedback current 58 from the gradient coil 18 from a reference current 60. The feedback current 58 from the gradient coil 18 is obtained by means of a current sensor. The difference between the reference current 60 and the feedback current 58 is termed as an error current 62. The gradient amplifier control stage 50 provides control signals to the bridge amplifiers 12, 14, 16 that vary the switching of the various transistor modules in each of the bridges 12, 14 and 16 that are connected in a manner as described previously. The first bridge amplifier 12 and the third bridge amplifier 14 handle reactive power delivered to the gradient coil 18, while the second bridge amplifier handles active power delivered to the gradient coil 18. An advantage of operating using the above mentioned embodiment is that no over-voltage of the DC voltage sources 20, 22 and 24 will occur for any kind of gradient coil current. If energy delivered to the gradient coil 18 by the first and third bridge amplifiers 12, 16 is returned to the DC voltage supply 22 of the second bridge amplifier 14, it can result in an over-voltage in the second bridge amplifier 14. Small deviations with respect to ideal operation may result in only a portion of the energy returned to the second bridge amplifier DC voltage supply. This portion of energy returned can easily be dissipated by bridge losses.

Figure 3:
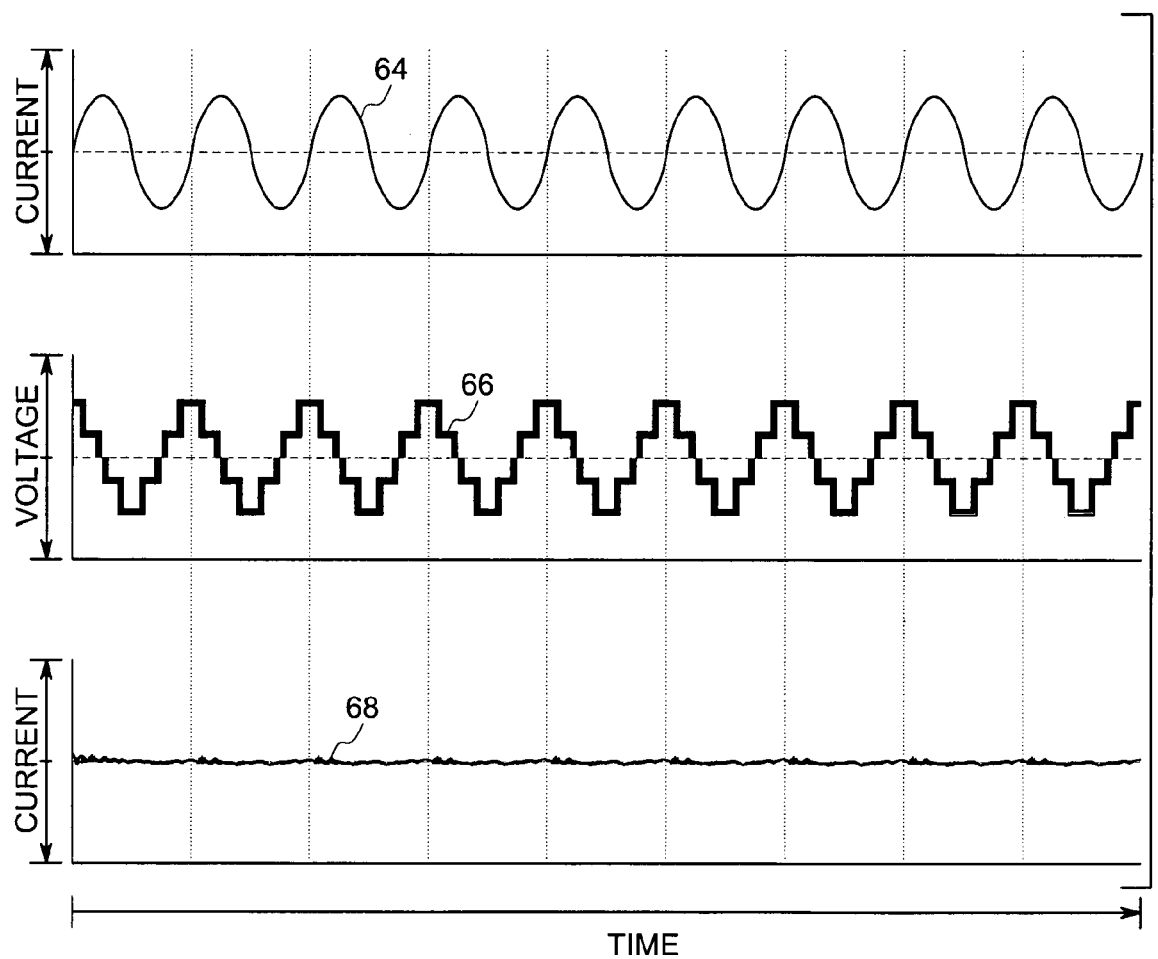
FIG. 3 illustrates typical waveforms of the gradient amplifier as depicted in FIG. 2.

FIG. 3 illustrates typical current and voltage waveforms for an embodiment of a gradient amplifier 28 (as illustrated in FIG. 1 and described previously) when the first DC voltage source, the second DC voltage source and the third DC voltage source are supplying 800 volts, 400 volts and 800 volts respectively. Plot 64 represents a sinusoidal current that drives the gradient coil 18 over a period of time. Plot 66 represents the voltage drop across the gradient coil that is proportional to the sinusoidal current 42 in the gradient coil 18. The voltage across the gradient coil is the sum of voltages provided by the individual bridge amplifiers 12, 14 and 16. In this case, the voltage across the gradient coil can swing from −2000 volts to +2000 volts based on how a pulse width modulation (PWM) scheme is applied. Plot 68 represents the error current that is the difference between the reference current and the actual coil current. The error current is small due to reasons discussed in the earlier section.

Figure 4:
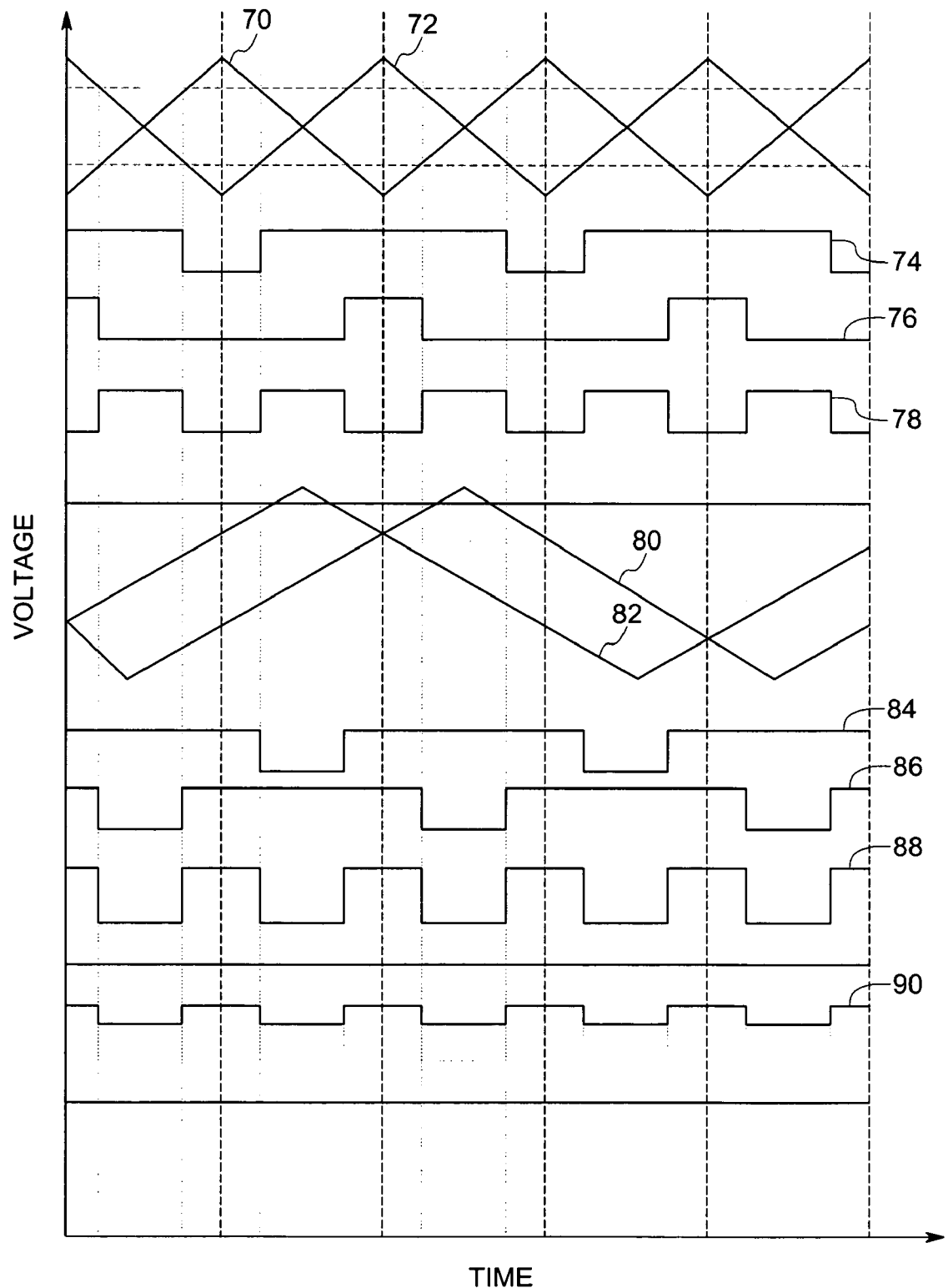
FIG. 4 is an illustration of a pulse width modulation scheme implemented for the first embodiment of the gradient amplifier control module of a gradient amplifier of the type illustrated in FIG. 2.

FIG. 4 illustrates a PWM scheme for an embodiment of a gradient amplifier as illustrated in FIG. 2 over a simulated time when the first bridge amplifier 12, the second bridge amplifier 14 and the third bridge amplifier 16, are operating at exemplary voltages of 800 volts, 400 volts and 800 volts respectively. Plots 70 and 72 represent a PWM carrier waveform for performing a PWM control scheme. Plot 74 represents a voltage across one leg in the second bridge amplifier 14. Plot 76 represents a voltage across the second leg in the second bridge amplifier 14. Plot 78 represents the output voltage of the second bridge amplifier. Plots 80, 82 represent the PWM carriers from the gradient amplifier control stage 30. Plot 84 represents output voltage of the first bridge amplifier 12. Plot 86 represents output voltage of the third bridge amplifier 16. Plot 88 represents a sum of the output voltages in the first and third bridge amplifiers 12, 16 indicated by plots 84 and 86. Plot 90 represents the total voltage across the gradient coil 18, which is a sum of voltages in the three bridge amplifiers 12, 14, 16 (indicated by plots 78 and 88).

As will be appreciated by those skilled in the art, separate, yet interrelated PWM control schemes may be implemented for each of the amplifiers to obtain combinations of output voltages and currents due to interactions of the output of each of the amplifiers. Moreover, by applying different voltages and different switching frequencies, noise may be substantially reduced as compared to heretofore known gradient amplifiers.

Figure 5:
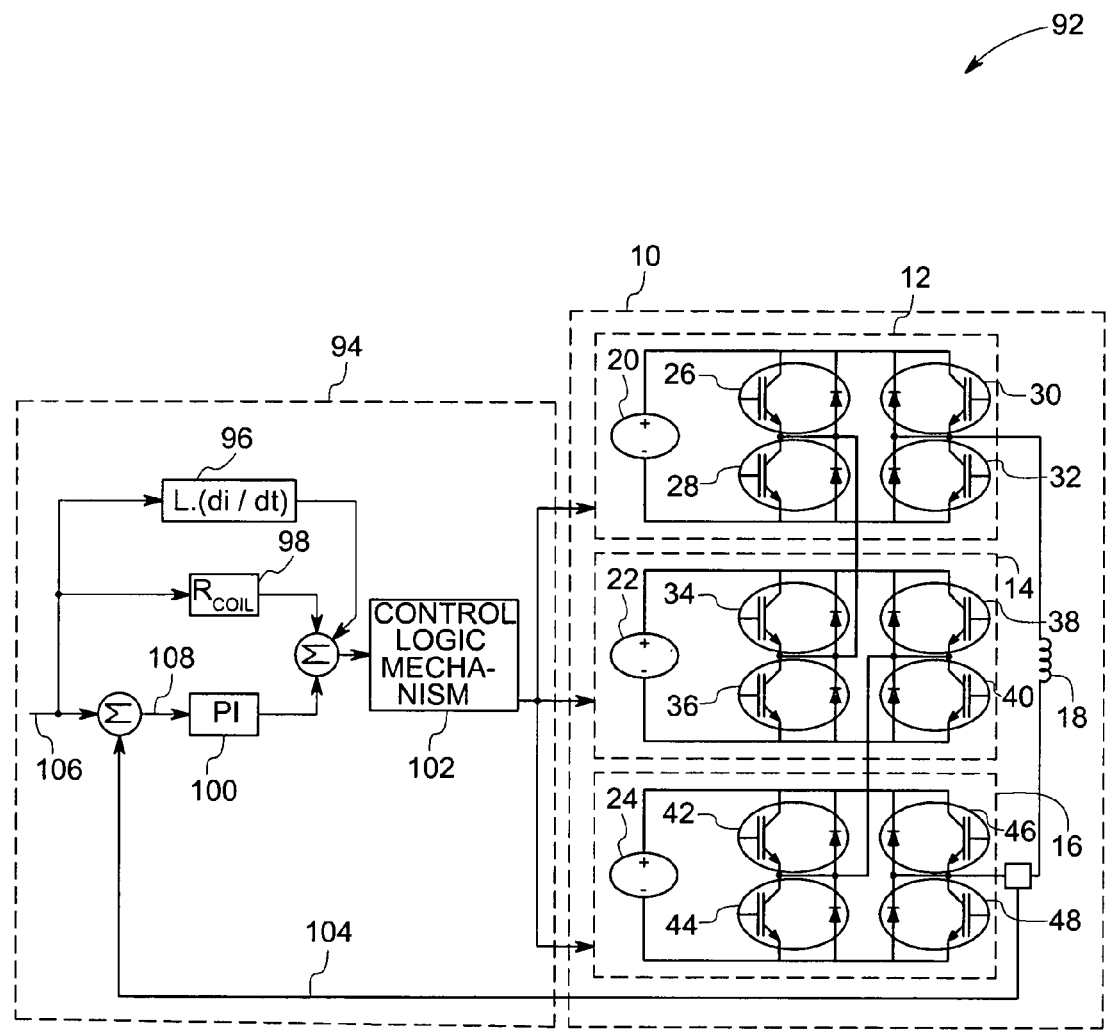
FIG. 5 is a schematic illustration of an exemplary gradient amplifier comprising a gradient amplifier power stage of the type shown in FIG. 1, and another embodiment of a gradient amplifier control stage.

FIG. 5 illustrates an exemplary gradient amplifier 92 comprising a gradient amplifier power stage 10 (as illustrated in FIG. 1) and a second embodiment of a gradient amplifier control stage 94. The gradient amplifier control stage 94 includes a feed forward mechanism 96 based on an inductance voltage drop across the gradient coil 18, a feed forward control mechanism 98 based on a resistive voltage drop of the gradient coil 18 and a proportional integral (PI) control mechanism 100 that provides a feedback based on a deviation of a feedback current 104 from the gradient coil 18 from a reference current 106. The feedback current 58 from the gradient coil 18 is obtained by means of a current sensor. The PI control mechanism 72 helps to drive the error current 108 down progressively and improves transient response. The gradient amplifier control stage 94 further includes a control logic module 102 that incorporates a control logic mechanism that will be discussed in greater detail in the following section, to perform a pulse width modulation to achieve minimal switching loss.

FIG. 6 illustrates an exemplary control logic mechanism 110 used in the control logic module 102 in the gradient amplifier control stage 94 in an embodiment of the gradient amplifier 92 as illustrated in FIG. 5. The gradient amplifier 92 is, in a present embodiment, capable of providing the gradient coil 18 with a voltage from −2000 volts to +2000 volts when the first, second and third bridge amplifiers 12, 14 and 16 are adapted to operate at exemplary voltages of 800 volts, 400 volts and 800 volts respectively. Row 112 represents specific voltage sub-ranges between −2000 volts and +2000 volts which the gradient amplifier can supply to the gradient coil 18, while column 120 indicates the various bridge amplifiers of the device. Row 114 represents the voltage contributed by the first bridge amplifier 12 to the gradient coil 18. Row 116 represents the voltage contributed by the second bridge amplifier 14 to the gradient coil 18. Row 118 represents the voltage contributed by the third bridge amplifier 16 to the gradient coil. Columns 122 through 140 correspond to the output from the three bridge amplifiers 12, 14 and 16 for the various voltage sub-ranges that vary from −2000 volts to +2000 volts in this exemplary case. In FIG. 6, 'D' and '1-D' refer to a ratio of PWM where indicated. It is worth noting that, while in this exemplary case the first and third bridge amplifiers 12, 16 are not pulse width modulated at the same time, it is quite possible in other embodiments of the present technique that these bridges can be pulse width modulated together.

In a present embodiment, because the input voltages to the bridge amplifiers are provided by a standard power supply that cannot return power back to its source, the energy delivered to the coil by each power supply is regulated to be positive. Such operation may effectively help eliminate energy balance issues that can arise during operation. In practice, the gradient coil charges and discharges when the current in the gradient coil changes. If a proper control logic mechanism is not employed the gradient coil 18 may be charged from the high voltage supplies 20, 24 and the gradient coil 18 would discharge into the lower voltage supply 22, resulting in an increase in the DC voltage supply 22 over time. To maintain the balance of energy and avoid such charge buildup, the voltage from the first and second bridge amplifiers 12, 16 is switched between the voltage ranges −1600 to −1200 volts, −800 volts to −400 volts, 400 volts to 800 volts and 1200 volts to 1600 volts represented by columns 124, 128, 134 and 138 respectively. Such switching maintains duty cycle of the DC voltage supply 22 from the second bridge amplifier 14 unchanged, but with an opposite polarity for the indicated voltage boundaries of in this exemplary case. The control logic mechanism 110 ensures that no over-voltage condition will occur when operation across one the voltage boundaries.

FIG. 7 graphically illustrates a relationship 142 between control voltages that correspond to voltage sub-ranges indicated by rows 114, 116 and 118 in FIG. 6 and output voltages across the three bridge amplifiers 12, 14, 16 for the gradient amplifier 92 illustrated in FIG. 5 using the control logic mechanism 110 illustrated in FIG. 6. The horizontal axis 144 represents the control voltage at the input of the control logic 102 in FIG. 5. Vertical axis 146 represents an output voltage from the second bridge amplifier 14 resulting from a PWM control scheme indicated in FIG. 6, while vertical axis 148 represents a combined output voltages from the first and third bridge amplifiers 12, 16. Plot 150 represents the output voltage from the second bridge amplifier 14 operating at 400 volts DC when subjected to the PWM control as illustrated in FIG. 6. Plot 152 represents the combined output voltage from the first and third bridge amplifiers 12, 16 operating at 800 volts each when subjected to the PWM scheme as illustrated in FIG. 6. The various voltage intervals 154 through 172 correspond to columns 122 through 140 as indicated in FIG. 6.

Figure 8:
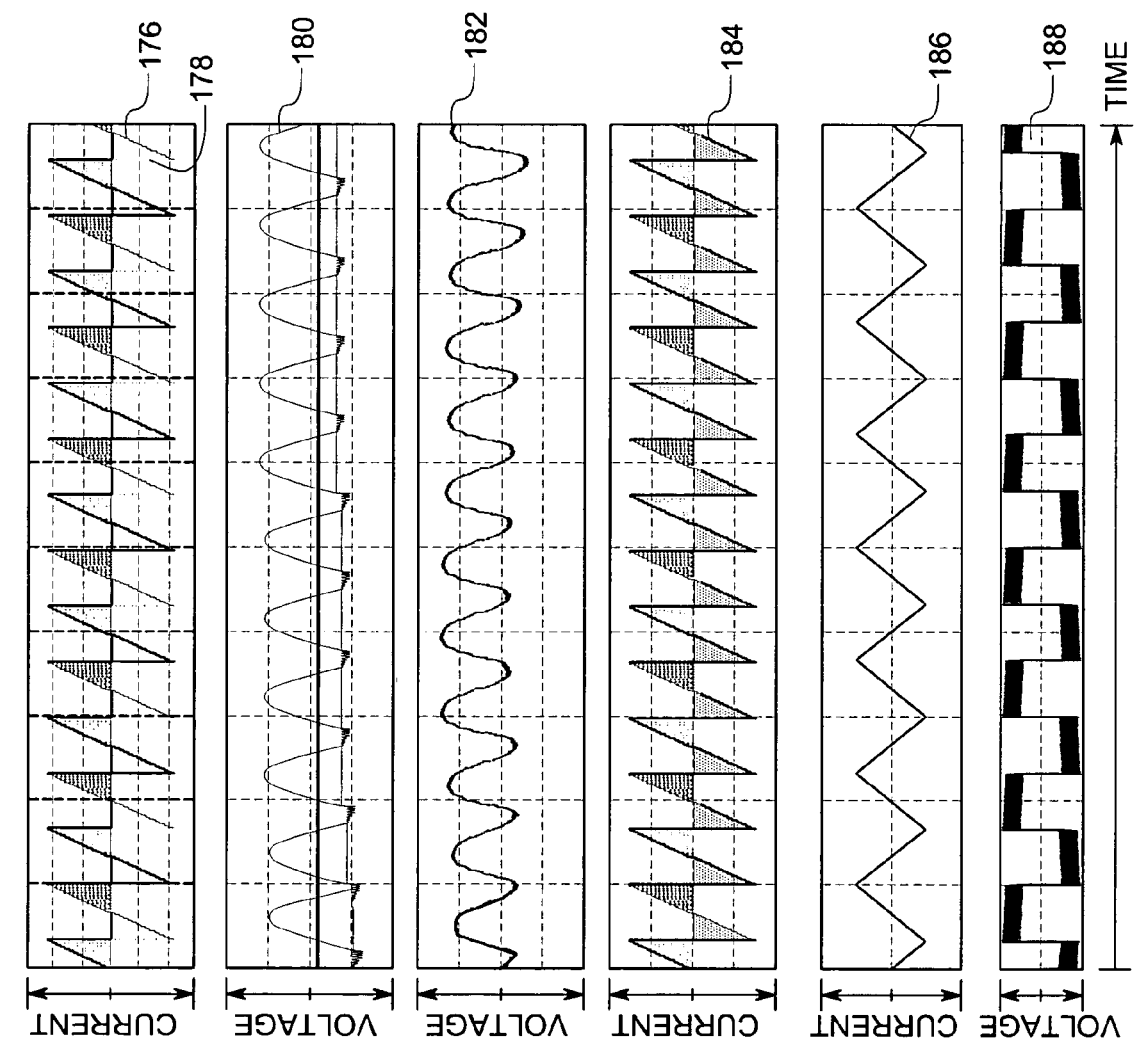
FIG. 8 is a graphical representation of typical simulation results for an echo planer imaging (EPI) waveform in an embodiment of a gradient amplifier as illustrated in FIG. 5.

FIG. 8 illustrates typical simulation results for an echo planar imaging (EPI) waveform of a type applicable for MRI systems over a simulated time, using the control logic mechanism 142 for a gradient amplifier control stage as illustrated in FIG. 4 and operating with 1200 volts across the gradient coil 18. Plots 176 and 178 represent input current to the first and third bridge amplifiers 12, 16, each operating at 800 volts. Plot 180 represents the input voltage to the first and third bridge amplifiers 12, 16. Plot 182 represents the input voltage to the second bridge amplifier 14 operating at 400 volts. Plot 184 represents input current to the second bridge amplifier 14 operating at 400 volts. Plot 186 represents feedback current measured from the gradient coil 18. Plot 188 represents the voltage across the gradient coil 18. As can be seen from the graphical representation of FIG. 8, we see that the voltage across the second bridge amplifier (represented by plot 180) maintains a constant ripple indicating stable operation with no over-voltage.

Figure 9:
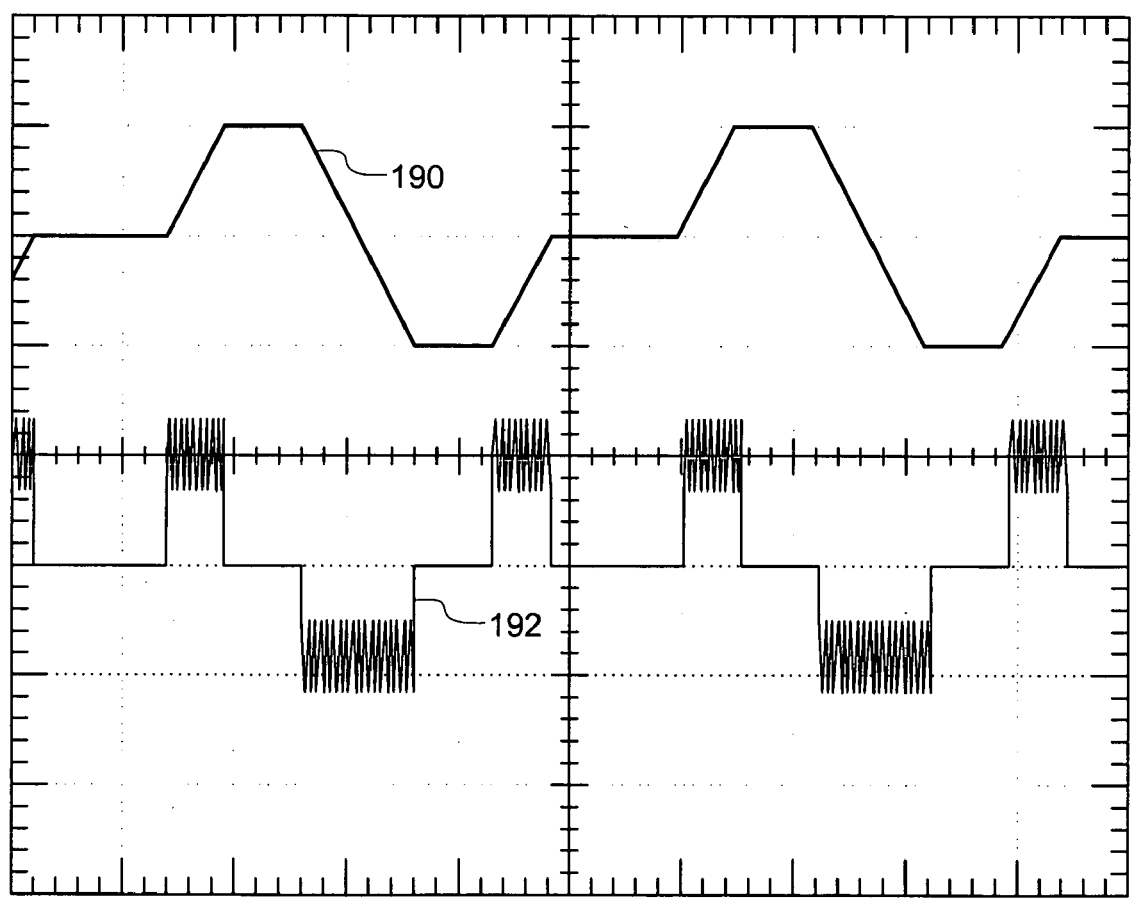
FIG. 9 illustrates typical voltage and current simulation waveforms for a gradient coil using an embodiment of a gradient amplifier control stage as illustrated in FIG. 2.

FIG. 9 represents simulated waveforms over time for a gradient amplifier using an embodiment of the gradient amplifier as illustrated in FIG. 2. Plot 190 represents an exemplary portion of a pulse sequence description to be applied to one gradient coil, which is a representation of all pulse signals generated over time for a simulation. As will be appreciated by those skilled in the art, other pulse sequences would be applied to other gradient coils in the system. Plot 192 represents the resulting voltage across the gradient coil 18 over the simulated time corresponding to the pulse sequence description 190, employing the foregoing circuit configuration and control approach.

As will be appreciated by those skilled in the art, the exemplary methods of providing a current to a gradient coil using embodiments of a gradient amplifier as illustrated in FIGS. 2–5 have been described by way of example only. In the illustrated embodiments, the first bridge amplifier 12 is coupled to a first DC voltage supply 20, the second bridge amplifier 14 is coupled to a second DC voltage supply 22 and the third bridge amplifier 16 is coupled to a third DC voltage supply 24. Secondly, the three bridge amplifiers 12, 14 and 16 are coupled in series with a gradient coil 18. Furthermore, a PWM scheme using a gradient amplifier control stage is applied across the gradient amplifier to generate required current and voltage levels across the gradient coil 18. This pulse width modulation scheme can include either of the gradient amplifier control stages illustrated and described previously. In one implementation, reactive power to the gradient coil may be applied through a first set of bridge amplifiers and active power to the gradient coil may be applied through a second set of bridge amplifiers which are coupled in series with the first set of bridge amplifiers. The application of the active and reactive powers to the gradient coil may be controlled through both the first and second set of bridge amplifiers. In another implementation, the application of active and reactive powers to the gradient coil may be controlled by applying full or no power through one of the first and second set of bridge amplifiers and by applying a pulse width modulated power through the other of the first and second set of bridge amplifiers. In yet another implementation of the present technique, the application of active and reactive powers to the gradient coil may be controlled by pulse width modulating the power from both the first and the second set of bridge amplifiers. In certain embodiments, the pulse width modulation of the power applied to the gradient coil may be as illustrated in FIG. 6. While all examples and simulations have been illustrated with specific operating voltages for the three bridge amplifiers 12, 14 and 16, these should be in no way considered as limiting. The above mentioned control stages and control logic mechanisms described herein may be adapted for any user desired voltage range that would be required to operate a gradient coil for an MRI system, or for any other suitable application.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A gradient amplifier power stage for providing a current to a gradient coil, comprising:
   a first bridge amplifier;
   a first DC voltage source coupled in parallel to the first bridge amplifier and configured for providing voltage supply at a first voltage to the first bridge amplifier;
   a second bridge amplifier coupled in series with the first bridge amplifer;
   a second direct-current voltage source coupled in parallel to the second bridge amplifier and configured for providing voltage supply at a second voltage to the second bridge amplifier;
   a third bridge amplifier coupled in series with both the first bridge amplifier and the second bridge amplifier; and
   a third direct-current voltage source coupled in parallel to the third bridge amplifier and configured for providing voltage supply at a third voltage to the third bridge amplifier, wherein the first bridge amplifier and the third bridge amplifier are configured to provide an inductive voltage drop in the gradient coil and the second bridge amplifier is configured to provide a resistive voltage drop in the gradient coil.

2. The gradient amplifier power stage of claim 1, wherein the second voltage of the second direct current voltage source is less than the first voltage of the first direct current voltage source.

3. The gradient amplifier power stage of claim 1, wherein the first direct-current voltage and the third direct-current voltage can substantially be equivalent.

4. The gradient amplifier power stage of claim 1, wherein the first direct-current voltage is 800 volts.

5. The gradient amplifier power stage of claim 1, wherein the second direct-current voltage is 400 volts.

6. The gradient amplifier power stage of claim 1, wherein the first bridge amplifer switches at a first frequency, the second bridge amplifier switches at a second frequency, and the third bridge amplifier switches at a third frequency.

7. The gradient amplifier power stage of claim 6, wherein the first frequency is different from the second frequency.

8. The gradient amplifier power stage of claim 6, wherein the first frequency is 31.25 kHz.

9. The gradient amplifier power stage of claim 6, wherein the second frequency is 62.5 kHz.

10. The gradient amplifier power stage of claim 6, wherein the first frequency and the third frequency are substantially equivalent.

11. The gradient amplifier power stage of claim 1, wherein the gradient coil is coupled in series with the first bridge amplifier, the second bridge amplifier and the third bridge amplifier.

12. The gradient amplifier power stage of claim 1, wherein the gradient coil is adapted to work in a magnetic resonance imaging system.

13. A gradient amplifier, comprising:
a gradient amplifier power stage comprising:
a first bridge amplifier;
a first direct-current voltage source coupled in parallel to the first bridge amplifier and configured for providing voltage supply at a first voltage to the first bridge amplifier;
a second bridge amplifier coupled in series with the first bridge amplifier;
a second direct-current voltage source coupled in parallel to the second bridge amplifier and configured for providing voltage supply at a second voltage to the second bridge amplifier;
a third bridge amplifier coupled in series with the first bridge amplifer and the second bridge amplifier; and
a third direct-current voltage source coupled in parallel to the third bridge amplifier and configured for providing voltage supply at a third voltage to the third bridge amplifier; and
a first gradient amplifier control stage, wherein the first gradient amplifier control stage comprises a first feedforward control mechanism for the first bridge amplifier and the third bridge amplifier, a second feedforward control mechanism for the second bridge amplifier, and a proportional integral control mechanism for the second bridge amplifier that provides a feedback based on a deviation of a feedback current from a reference current and based on an amount of time the deviation of the feedback current from the reference current is present.

14. The gradient amplifier of claim 13, wherein a gradient coil is coupled in series with the first bridge amplifier, the second bridge amplifier and the third bridge amplifier.

15. The gradient amplifier of claim 13, wherein the first bridge amplifer switches at a first frequency, the second bridge amplifier switches at a second frequency, and the third bridge amplifier switches at a third frequency.

16. The gradient amplifier power stage of claim 15, wherein the first frequency is different from the second frequency.

17. The gradient amplifier power stage of claim 15, wherein the first frequency and the third frequency are substantially equivalent.

18. The gradient amplifier of claim 14, wherein the first bridge amplifier and the third bridge amplifier are configured to provide an inductive voltage drop in the gradient coil and the second bridge amplifier is configured to provide a resistive voltage drop in the gradient coil.

19. The gradient amplifier of claim 13, wherein the gradient amplifier is adapted to work with a magnetic resonance imaging system.

20. A power amplifier, comprising:
an amplifier power stage comprising:
a first bridge amplifier; a first direct-current voltage source coupled in parallel to the first bridge amplifier and configured for providing voltage supply at a first voltage to the first bridge amplifier;
a second bridge amplifier coupled in series with the first bridge amplifier;
a second direct-current voltage source coupled in parallel to the second bridge amplifier and configured for providing voltage supply at a second voltage to the second bridge amplifier;
a third bridge amplifier coupled in series with the first bridge amplifer and the second bridge amplifier; and
a third direct-current voltage source coupled in parallel to the third bridge amplifier and configured for providing voltage supply at a third voltage to the third bridge amplifier; and
a gradient amplifier control stage, wherein the first bridge amplifier and the third bridge amplifier are configured to provide an inductive voltage drop in a gradient coil and the second bridge amplifier is configured to provide a resistive voltage drop in the gradient coil.

21. The power amplifier of claim 20, wherein the gradient coil is coupled in series with the first bridge amplifier, the second bridge amplifier and the third bridge amplifier.

22. The power amplifier of claim 20, wherein the first bridge amplifer operating at the first voltage switches at a first frequency, the second bridge amplifier switches at a second frequency, and the third bridge amplifier switches at a third frequency.

23. The power amplifier power stage of claim 22, wherein the first frequency is different from the second frequency.

24. The power amplifier power stage of claim 22, wherein the first frequency and the third frequency are substantially equivalent.

25. The power amplifier of claim 20, wherein the gradient amplifier control stage comprises at least one of a first feedforward control mechanism, a second feedforward control mechanism, a proportional integral control mechanism that provides a feedback based on a deviation of a feedback current from a reference current and based on an amount of time the deviation of the feedback current from the reference current is present, and a control logic mechanism that provides a modulation to the first bridge amplifier, the second bridge amplifier and the third bridge amplifier.

26. A method for providing a electrical power to a coil comprising:
providing a voltage supply at a first voltage to a first bridge amplifier;
providing a voltage supply at a second voltage to a second bridge amplifier;
providing a voltage supply at a third voltage to a third bridge amplifier;
coupling the first bridge amplifier in series with the second bridge amplifier;
coupling the second bridge amplifier in series with the third bridge amplifier;
coupling the coil in series with the third bridge amplifier and the first bridge amplifier; and
applying a pulse width modulation scheme to the series combination of the first bridge amplifier, the second bridge amplifier, the third bridge amplifier, wherein the first bridge amplifier and the third bridge amplifier are configured to provide an inductive voltage drop in the coil and the second bridge amplifier is configured to provide a resistive voltage drop in the coil.

27. The method of claim 26, wherein a pulse width modulation scheme is further applied to the coil.

28. A method for providing electrical power to a coil comprising:

applying reactive power to the coil via a first set of amplifier bridges;

applying active power to the coil via a second set of amplifier bridges coupled in series with the first set of amplifier bridges; and controlling the applying of reactive power and applying active power via the first and second sets of amplifier bridges using a first feedforward control mechanism, a second feedforward control mechanism, and a proportional integral control mechanism.

29. The method of claim 28, wherein reactive power is applied to the coil via at least two first sets of amplifier bridges.

30. The method of claim 28, wherein control of the first set of amplifier bridges is performed based only upon feedforward control signals.

31. The method of claim 28, wherein the first set of amplifier bridges provides power at a different voltage than the second set of amplifier bridges.

32. The method of claim 28, wherein the first set of amplifier bridges provides power at a different switching frequency than the second set of amplifier bridges.

33. A method for providing electrical power to a coil comprising:

applying power to the coil at a first voltage level via a first set of switched bridge amplifiers based upon the inductance of the coil, wherein the first set of switched bridge amplifiers is configured to provide an inductive voltage drop in the coil;

applying power to the coil at a second voltage level lower than the first voltage level via a second set of switched bridge amplifiers in series with the first set of switched bridge amplifiers, wherein the second set of switched bridge amplifiers is configured to provide a resistive voltage drop in the coil; and controlling the applying of power via the first and second sets of switched bridge amplifiers.

34. The method of claim 33, wherein power is applied to the coil at the first voltage level via at least two first sets of switched bridge amplifiers.

35. The method of claim 33, wherein control of the first set of switched bridge amplifiers is performed based only upon feedforward control signals.

36. The method of claim 33, wherein the first set of switched bridge amplifiers provides power at a different switching frequency than the second set of switched bridge amplifiers.

37. A method for providing electrical power to a coil comprising:

applying power to the coil via a first set of switched bridge amplifiers;

applying power to the coil via a second set of switched bridge amplifiers in series with the first set of switched bridge amplifiers; and controlling the first and second sets of switched bridge amplifiers by using at least a first feedforward control mechanism, a second feedforward control mechanism, and a proportional integral control mechanism, wherein the first set of switched bridge amplifiers is configured to provide an inductive voltage drop in the coil and the second set of switched bridge amplifiers is configured to provide a resistive voltage drop in the coil.

38. The method of claim 37, wherein the first and second sets of switched bridge amplifiers are controlled to avoid circulation of power among the switched bridge amplifiers.

39. The method of claim 37, wherein the first and second sets of switched bridge amplifiers apply power at different voltage levels.

40. The method of claim 37, wherein two first sets of switched bridge amplifiers apply power to the coil at a first voltage and a single set of switched bridge amplifiers applies power to the coil at a second voltage lower than the first voltage.

41. A method for providing electrical power to a coil comprising:

applying power to the coil via a first set of switched bridge amplifiers;

applying power to the coil via a second set of switched bridge amplifiers in series with the first set of switched bridge amplifiers; and controlling the first and second sets of switched bridge amplifiers via a first feedforward control mechanism for the first set of switched bridge amplifiers, a second feedforward control mechanism for the second set of switched bridge amplifiers, and a proportional integral control mechanism for the second set of switched bridge amplifiers that provides a feedback based on a deviation of a feedback current from a reference current and based on an amount of time the deviation of the feedback current from the reference current is present.

42. The method of claim 41, wherein the first and second sets of switched bridge amplifiers are switched at different switching frequencies.

43. The method of claim 41, wherein the first and second sets of switched bridge amplifiers are controlled to avoid circulation of power among the switched bridge amplifiers.

44. The method of claim 41, wherein the first and second sets of switched bridge amplifiers apply power at different voltage levels.

45. The method of claim 41, wherein two first sets of switched bridge amplifiers apply power to the coil at a first voltage and a single set of switched bridge amplifiers applies power to the coil at a second voltage lower than the first voltage.

* * * * *